United States Patent
Walker et al.

(10) Patent No.: US 9,280,628 B2
(45) Date of Patent: Mar. 8, 2016

(54) SYSTEM AND METHOD FOR CLOCK NETWORK META-SYNTHESIS

(75) Inventors: William Walker, Los Gatos, CA (US); Subodh M. Reddy, San Jose, CA (US)

(73) Assignee: Fujitsu Limited, Kawasaki-shi (JP)

( * ) Notice: Subject to any disclaimer, the term of this patent is extended or adjusted under 35 U.S.C. 154(b) by 29 days.

(21) Appl. No.: 13/214,859

(22) Filed: Aug. 22, 2011

(65) Prior Publication Data

US 2013/0055186 A1    Feb. 28, 2013

(51) Int. Cl.
*G06F 17/50*    (2006.01)

(52) U.S. Cl.
CPC .......... *G06F 17/505* (2013.01); *G06F 2217/62* (2013.01)

(58) Field of Classification Search
None
See application file for complete search history.

(56) References Cited

U.S. PATENT DOCUMENTS

| | | | |
|---|---|---|---|
| 6,925,622 B2* | 8/2005 | Reyes | 716/114 |
| 7,216,322 B2* | 5/2007 | Lai et al. | 716/114 |
| 7,356,785 B2* | 4/2008 | Lu et al. | 716/114 |
| 7,725,852 B2 | 5/2010 | Chen et al. | 716/6 |
| 7,788,613 B2 | 8/2010 | Walker et al. | 716/5 |
| 7,801,718 B2 | 9/2010 | Reddy et al. | 703/14 |
| 7,802,215 B2 | 9/2010 | Reddy et al. | 716/6 |
| 8,095,900 B2* | 1/2012 | Sircar et al. | 716/104 |
| 2004/0064799 A1* | 4/2004 | Reyes | 716/6 |
| 2004/0221249 A1* | 11/2004 | Lahner et al. | 716/4 |
| 2005/0010884 A1* | 1/2005 | Lu et al. | 716/6 |
| 2008/0148204 A1* | 6/2008 | Bueti et al. | 716/6 |
| 2008/0229265 A1* | 9/2008 | Bueti et al. | 716/6 |
| 2008/0229266 A1* | 9/2008 | Bueti et al. | 716/6 |
| 2010/0049481 A1 | 2/2010 | Walker et al. | 703/2 |

OTHER PUBLICATIONS

Wikipedia; "Clock gating"; www.wikipedia.org; pp. 2, Jun. 2, 2011.
Wikipedia; "Clock distribution network"; www.wikipedia.org; pp. 4, Jun. 2, 2011.

* cited by examiner

*Primary Examiner* — A. M. Thompson
(74) *Attorney, Agent, or Firm* — Baker Botts L.L.P.

(57) ABSTRACT

In accordance with some embodiments of the present disclosure a method for constructing a clock network comprises receiving design specifications for a clock network. The method further comprises determining a topology of the clock network based on the design specifications. The topology indicates at least one of a plurality of levels of the clock network, a buffer type for each level and a buffer fanout for each level. The method additionally comprises determining design parameters for the clock network based on the determined topology and generating a clock network synthesis tool specification file that includes the design parameters. The method also comprises synthesizing the clock network using the specification file such that the clock network includes the determined topology and such that the clock network synchronously distributes a clock signal from a clock generator to endpoints of the clock network.

20 Claims, 6 Drawing Sheets

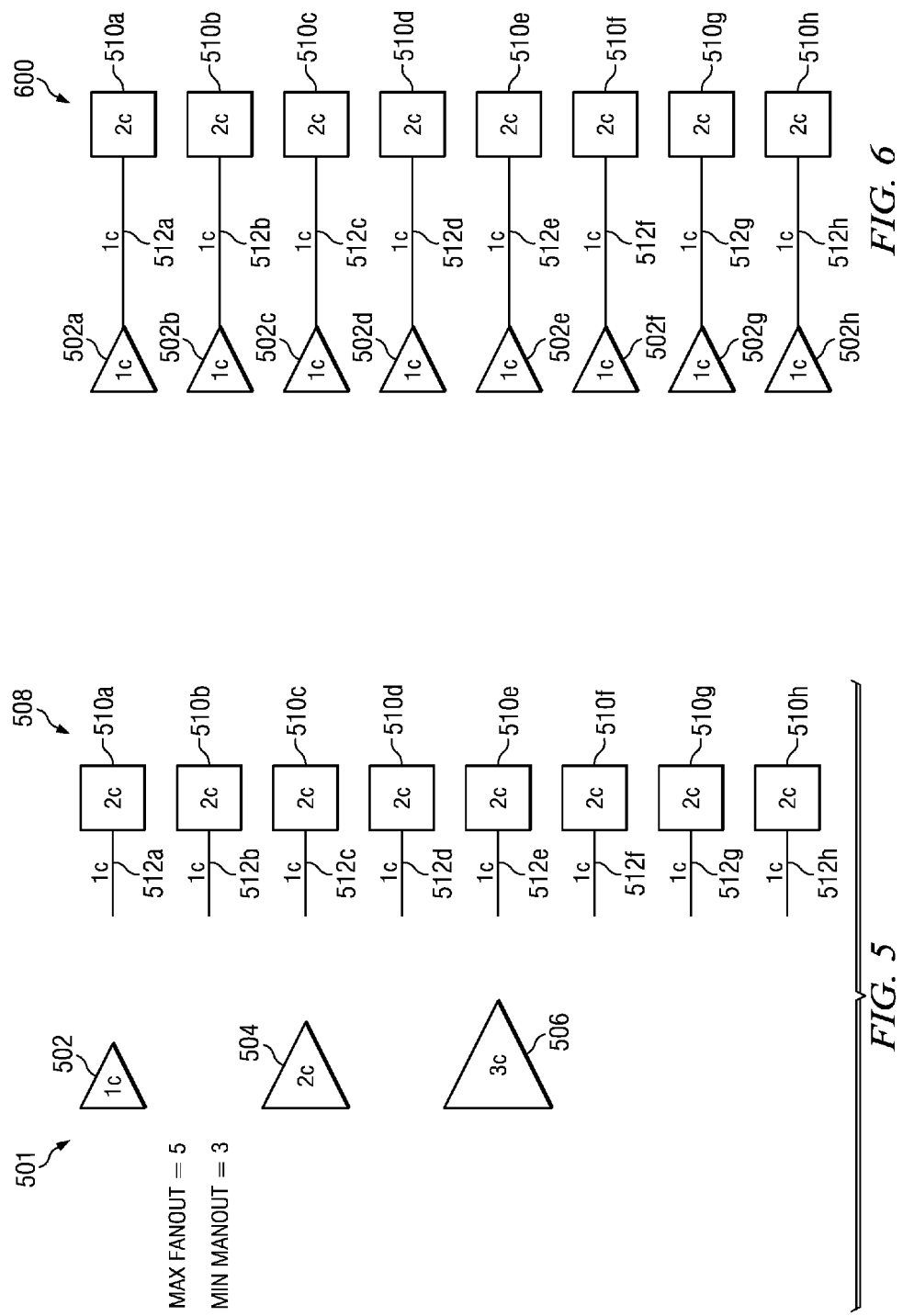

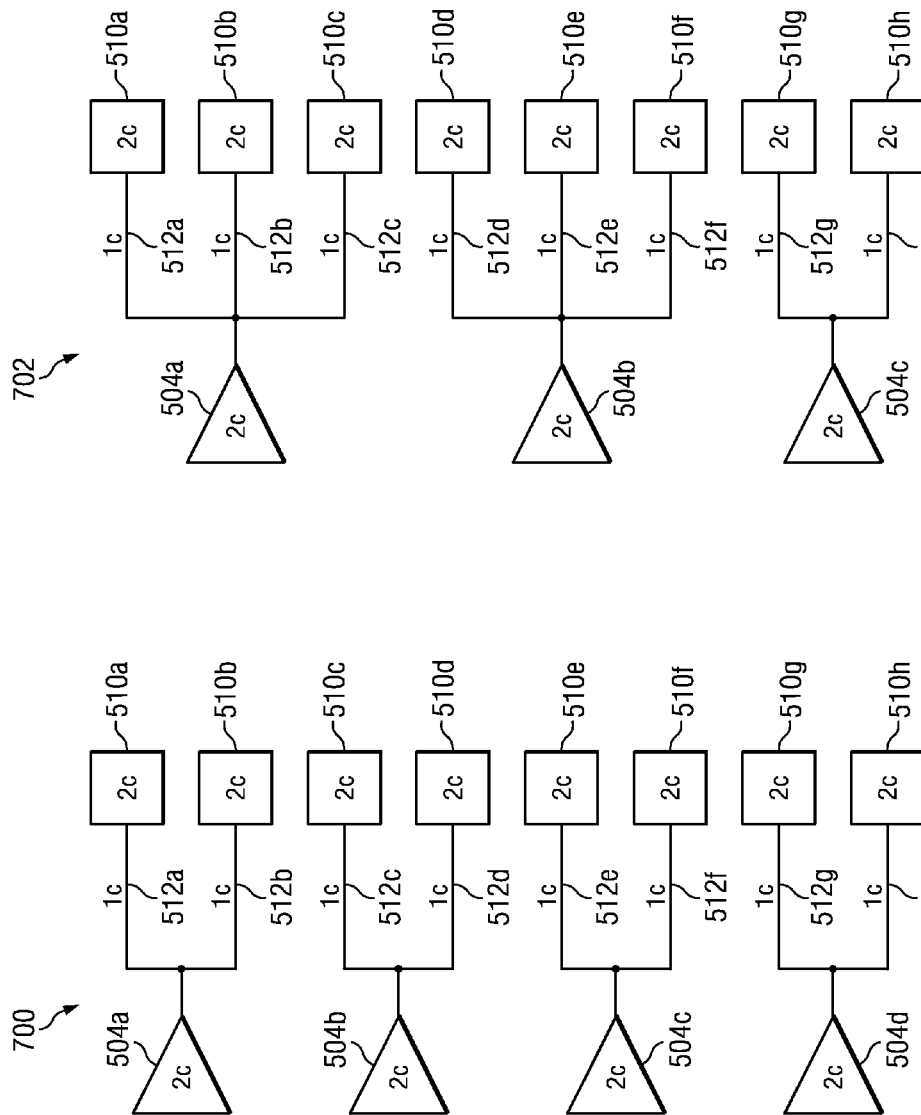

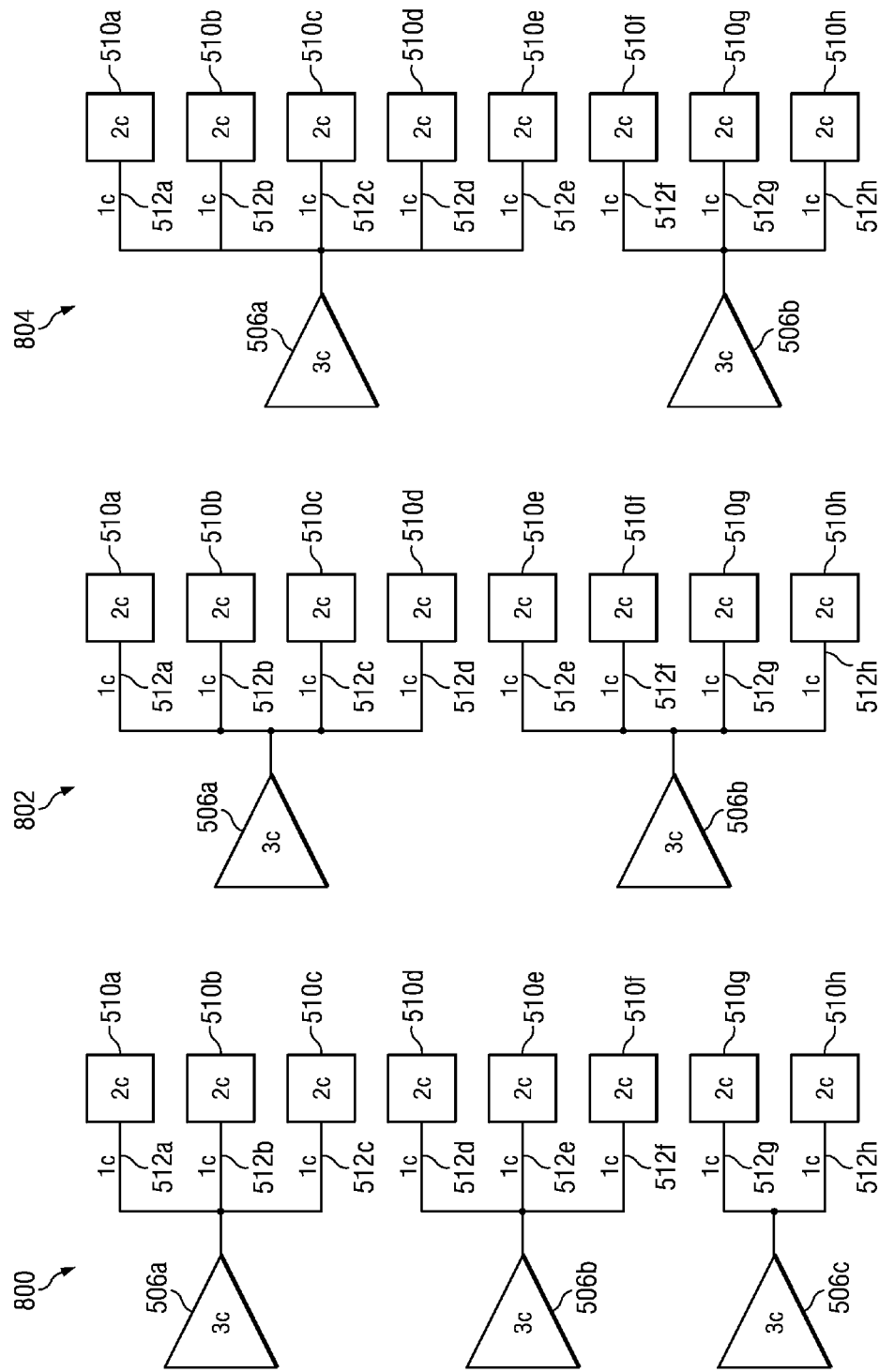

SYSTEM AND METHOD FOR CLOCK NETWORK META-SYNTHESIS

TECHNICAL FIELD

The present disclosure relates in general to integrated circuits and, more particularly, to techniques for designing and constructing clock distribution networks of integrated circuits.

BACKGROUND

A clock tree is used to distribute a clock to endpoints (e.g., flip-flops) in a synchronous digital integrated circuit (IC), such as a microprocessor. A synchronous design typically requires that all endpoints be clocked at the same time, or that their clocks have known offsets relative to each other. Failure to achieve required arrival times of clocks at endpoints results in either degraded performance (longer cycle time) or outright failure (a race condition).

It is a difficult challenge to design a clock distribution network that ensures synchronicity of clock arrival times, typically requiring special purpose software. However, the special purpose software may use various design assumptions and algorithms based off of a default specification file of the software tool ("tool specification") that may produce unsatisfactory results. Accordingly, a clock network designer may be required to manually input and change one or more design parameters in the tool specification file in an attempt to achieve the desired clock arrival times of a clock network. However, achieving the proper result may entail many different iterations of changing one or more input design parameters in the software tool, generating a clock network with the software tool based on the design parameters, and determining whether the generated clock network satisfies the design constraints. This manual process of trial and error can be tedious and time consuming.

SUMMARY

In accordance with some embodiments of the present disclosure a method for constructing a clock network comprises receiving design specifications for a clock network. The method further comprises determining a topology of the clock network based on the design specifications. The topology indicates at least one of a plurality of levels of the clock network, a buffer type for each level and a buffer fanout for each level. The method additionally comprises determining design parameters for the clock network based on the determined topology and generating a clock network synthesis tool specification file that includes the design parameters. The method also comprises synthesizing the clock network using the specification file such that the clock network includes the determined topology and such that the clock network synchronously distributes a clock signal from a clock generator to endpoints of the clock network.

BRIEF DESCRIPTION OF THE DRAWINGS

For a more complete understanding of the present disclosure and its advantages, reference is now made to the following description, taken in conjunction with the accompanying drawings, in which:

FIG. 5 illustrates an example of design specifications for a clock network according to some embodiments of the present disclosure;

FIG. 6 illustrates an example buffer configuration of buffers driving endpoints based on a fanout range and other design specifications according to some embodiments of the present disclosure;

FIGS. 7a and 7b illustrate example buffer configurations of buffers driving endpoints according to some embodiments of the present disclosure; and FIGS. 8a-8c illustrate other example buffer configurations of buffers driving endpoints according to some embodiments of the present disclosure.

DETAILED DESCRIPTION

Figure 1A:
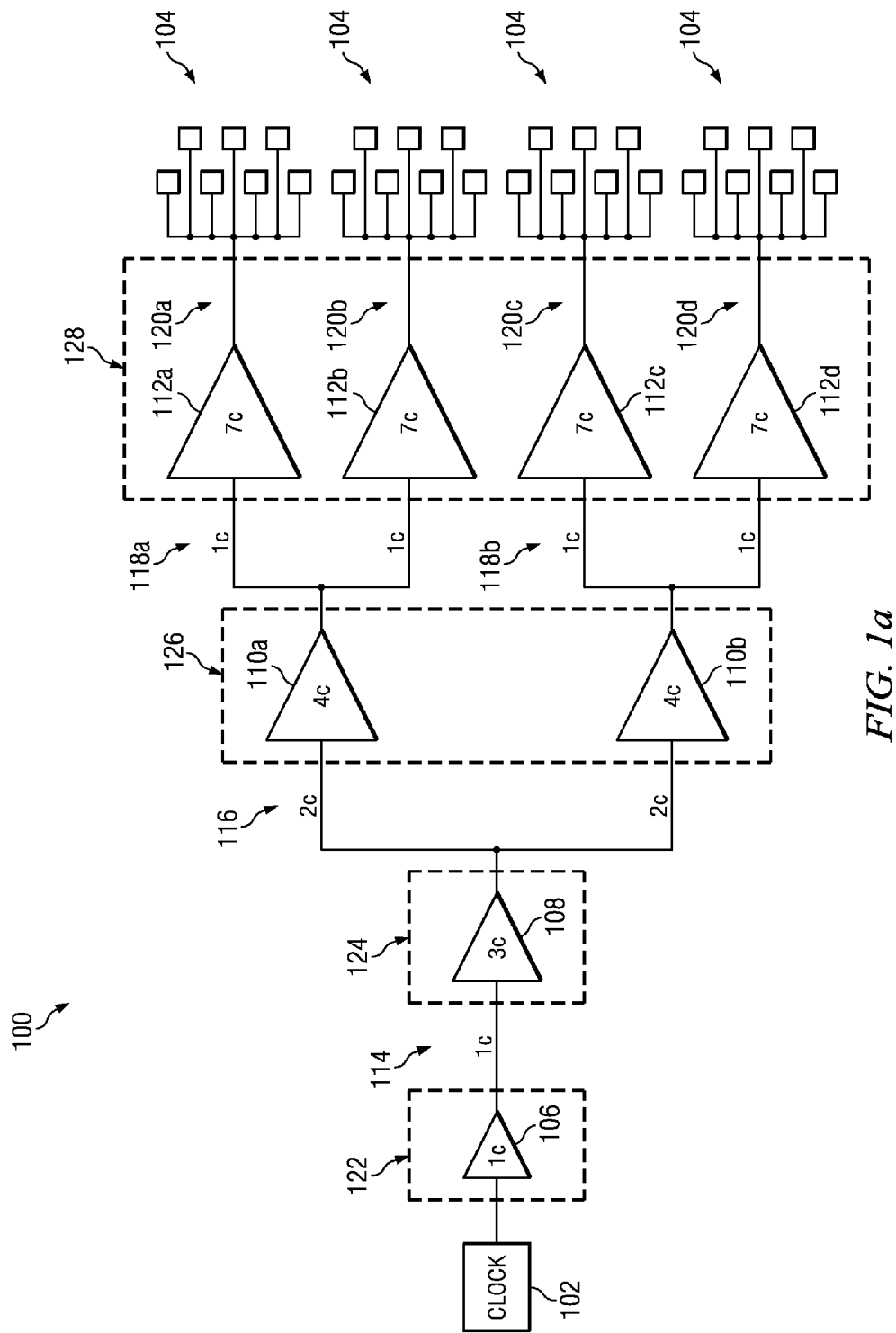
FIG. 1a illustrates an example of a clock network constructed according to the present disclosure.

FIG. 1a illustrates a clock network 100 designed and/or constructed according to the present disclosure. Clock network 100 may comprise a clock tree used to distribute a clock 102 to endpoints 104 (e.g., flip-flops) in a synchronous digital integrated circuit (IC), such as a microprocessor. In the present embodiment, clock network 100 may be configured such that each endpoint 104 receives clock 102 at substantially the same time.

Clock network 100 may be designed and/or constructed using special purpose clock network synthesis software ("a synthesis tool") and a clock network meta-synthesis software tool ("a meta-synthesis tool"). As described in further detail below, a meta-synthesis tool may be configured to receive design specifications for clock network 100 from a designer of clock network 100. Based on the design specifications received, the meta-synthesis tool may determine a topology of the clock network. The meta-synthesis tool may use the topology to determine design parameters for the clock network. The meta-synthesis tool may generate an input specification file for the software tool ("tool specification file") that includes the design parameters such that the software tool may synthesize clock network 100 according to the design desired by the designer. Therefore, the tedious and time consuming trial and error process of changing the tool specification file to achieve the desired clock network may be reduced or eliminated.

Returning to FIG. 1a, as described above clock network 100 may include a clock generator 102 that generates a clock signal that is to be received by endpoints 104. Clock generator 102 may comprise any suitable system, apparatus or device configured to generate an oscillating control signal that may be received by endpoints 104. Endpoints 104 may comprise any suitable system, apparatus or device that may perform operations or steps upon receiving a clock signal. In the present embodiment, endpoints 104 may comprise flip-flops of a microprocessor. Due to various electrical properties such as load capacitance, clock network 100 may include a series of buffers (e.g., buffers 106, 108, 110 and 112) used to distribute clock 102 to each endpoint 104. As described in further detail below, the buffers may be configured such that each endpoint 104 receives the clock signal at substantially the same time (e.g., within the allowed tolerances of clock network 100).

The buffers (e.g., buffers 106, 108, 110 and 112) of clock network 100 may comprise any suitable system, apparatus or device that may be used to distribute the clock signal generated by clock generator 102 to endpoints 104. In some instances, a buffer may comprise an inverter or a series of inverters. The buffers of clock network 100 may be a variety of types and may have a variety of sizes. The sizes of the buffers may relate to the input capacitance of each buffer such that the larger the buffer the larger the input capacitance. For example, buffer 106 may be relatively small and may have an input capacitance of one as indicated by "1c" in FIG. 1a. Buffer 108 may be larger than buffer 106 and may have an input capacitance of three as indicated by "3c" in FIG. 1a; buffers 110 may be larger than buffers 106 and 108 and may have an input capacitance of four as indicated by "4c" in FIG. 1a; and buffers 112 may be larger than buffers 110, 108 and 106 and may have an input capacitance of seven as indicated by "7c" in FIG. 1a. The "c" in FIG. 1a may refer to any appropriate unit of capacitance (e.g., farad, microfarad, etc.). Buffers 106, 108, 110 and 112 may be distributed within clock network 100 as a series of stages and levels. A stage may refer to a driving gate (e.g., a buffer) driving a load (e.g., another buffer or an endpoint 104) through a wire such that the clock signal may be passed from the driving buffer to the load. For example, clock network 100 may include a stage 114 where buffer 106 may drive buffer 108. Clock network 100 may also include a stage 116 where buffer 108 may drive buffers 110; a stage 118a where buffer 110a may drive buffers 112a and 112b; a stage 118b where buffer 110b may drive buffers 112c and 112d; and stages 120 where buffers 112 may each drive a group of endpoints 104. In some embodiments, the load being driven by a driving buffer (e.g., another buffer or an endpoint 104) may be referred to as a sink, and the driving buffer may be referred to as a root.

A level may refer to one or more driving buffers of a stage that are the same distance from clock generator 102. In the present embodiment, clock network 100 may include level 122 that comprises buffer 106, level 124 that comprises buffer 108, level 126 that comprises buffers 110 and level 128 that comprises buffers 112. Accordingly, in the present embodiment, each level may include the same type of driving buffers. The buffers of a level may be identical to each other, or may have similar properties. Buffers that have similar properties may be termed as "replicas" of each other. More specifically, if the term fanout is defined as the ratio of the output capacitance (load) that the driver is driving with respect to the input capacitance of the driver, two buffers having the same fanout properties may be considered replicas of each other and may exhibit the same delay. For example, as discussed in further detail below, the size and input capacitance of a buffer may be the properties of a buffer for a particular level that may need to be the same because these are the properties that may affect the delay associated with a buffer. Accordingly, all the driving buffers of a particular level may have the same input capacitance (e.g., buffers 112 of level 128 may have an input capacitance of seven) even though the driving buffers of a particular level may not be identical in all aspects.

Figure 1B:
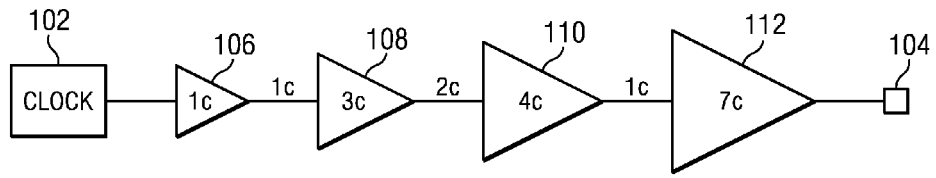
FIG. 1b illustrates an example path from a clock to an endpoint of a clock network according to some embodiments of the present disclosure.

By having the same buffer type (e.g., buffers with the same fanout) at each level, the path from clock generator 102 to each endpoint 104 may be the same in the terms of delay. Accordingly, the paths from clock generator 102 to each endpoint 104 may be replicas of each other in terms of delay, even if the paths are not physically identical. For example, FIG. 1b illustrates an example path from clock generator 102 to each endpoint 104. FIG. 1b illustrates that the path from clock generator 102 to endpoint 104 includes buffer 106, buffer 108, a buffer 110 and a buffer 112. This path may be the same for each endpoint 104, regardless of the endpoint 104 as can be seen in FIG. 1a.

The number, type and size of the buffers in clock network 100 for each level may be based on a desired fanout or fanout range for the buffers of clock network 100. As mentioned above, the fanout of a buffer may be a ratio of the total load capacitance on a buffer to the input capacitance of the buffer. The fanout may indicate the amount of delay experienced by a clock signal passing from one buffer to another buffer; therefore, the smaller the fanout the smaller the delay and vice versa. However, with a smaller fanout, a larger number of buffers and levels may be needed. Therefore, the fanout or fanout range of clock network 100 may be decided by a clock network designer to satisfy the particular design specifications of clock network 100. Additionally, because the fanout is related to delay, the fanout of each buffer at a particular level of clock network 100 may be the same to ensure that the delay from clock generator 102 to each endpoint 104 is the same.

The load capacitance of a buffer may include the capacitance of one or more sinks (e.g., buffers and/or endpoints) being driven by a buffer. Additionally, the load capacitance of a buffer may include any parasitic capacitance of a connection (e.g., wires) that couples the driving buffer to a load. For example, the load capacitance of buffer 106 may include the capacitance of buffer 108 (three) and the capacitance of the wire coupling buffer 106 to buffer 108 (one), such that the load capacitance of buffer 106 may be four (1+3). Accordingly, the fanout of buffer 106 may be the ratio of the load capacitance of buffer 106 (four) over the input capacitance of buffer 106 (one) such that the fanout of buffer 106 may be four (4/1=4). Similarly, the load capacitance of buffer 108 may be the capacitance of buffer 110a (four) and buffer 110b along with the capacitance of the wires coupling buffer 108 to buffers 110 (two each). Accordingly, the load capacitance of buffer 108 may be twelve (4+4+2+2). Additionally, the fanout of buffer 108 may also be four because the load capacitance (twelve) over the input capacitance of buffer 108 (three) equals four (12/3=4). The fanout of buffers 110 and 112 may be similarly calculated based on the load and input capacitances associated with those buffers.

As mentioned above, to ensure that the delay from clock 102 to each endpoint 104 is the same, the fanout of each buffer within a particular level may be the same. For example, the fanout of buffers 110a and 110b may be the same (e.g., four in the present example) such that the clock signal is received at buffers 112a and 112b from buffer 110a and received at buffers 112c and 112d from buffer 110b at the same time. Although the fanout of each driving buffer is depicted as being the same (e.g., four) in the present embodiment, it is understood that the fanout of a driving buffer at one level may be different from the fanout of a driving buffer at a different level as long as the fanout of the buffers associated with each level is the same and within an indicated fanout range.

Therefore, clock network 100 may be configured such that each endpoint 104 receives a clock signal generated by clock generator 102 at substantially the same time. As mentioned above, and described in further detail below, clock network 100 may be designed and/or constructed using a meta-synthesis tool configured to generate a tool specification file for a clock synthesis tool such that the clock synthesis tool may synthesize clock network 100 according to the design specifications envisioned by a designer of clock network 100.

Modifications, additions or omissions may be made to FIGS. 1a and 1b without departing from the scope of the present disclosure. For example, the number of endpoints, stages, buffers and/or levels may vary depending on the design characteristics of the integrated circuit that may include clock network 100. Additionally, the sizes and capacitances of the buffers and wires are for illustrative purposes only.

Figure 2:
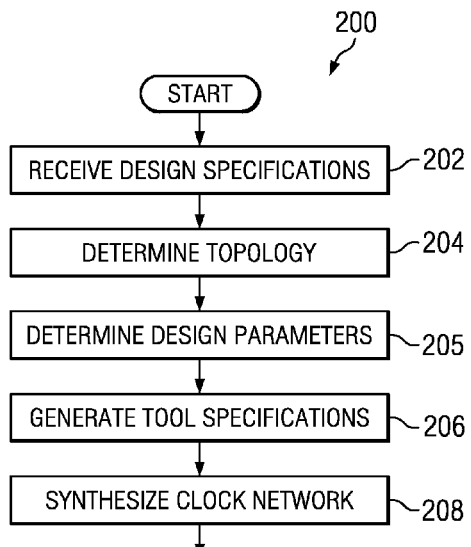
FIG. 2 is a flow diagram that illustrates one example of a method for designing and/or constructing a clock network according to the present disclosure.

FIG. 2 is a flow diagram that illustrates one example of a method 200 for designing and/or constructing a clock network according to the present disclosure.

Method 200 may be performed by any suitable system, apparatus or device. In the present embodiment, method 200 may be performed by an information handling system that may include a processor and memory.

An information handling system (IHS) may comprise any instrumentality or aggregate of instrumentalities configured to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may comprise a personal computer.

A processor of the information handling system may comprise any suitable system, apparatus or device configured to interpret and/or execute program instructions and/or process data, and may include without limitation a microprocessor, microcontroller, digital signal processor (DSP), application specific integrated circuit (ASIC), or any other digital or analog circuitry configured to interpret and/or execute program instructions and/or process data. In the present embodiment, a processor of the information handling system may perform the steps of method 200.

Memory may comprise any system, device or apparatus configured to retain program instructions or data for a period of time (e.g., computer-readable media). Memory may include random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to its respective processor is turned off. In the present embodiment, the memory may be communicatively coupled to the processor and may contain instructions for performing method 200. For example, the memory may include instructions for executing a clock network meta-synthesis software tool and a clock network synthesis software tool. The processor may accordingly be configured to access the instructions on the memory and perform method 200.

Method 200 may begin, and at step 202 a meta-synthesis tool may receive design specifications from a designer of a clock network. The design specifications may include the endpoints that may be driven by one or more clock networks. The endpoints may be received in groups associated with a specific clock domain that may be associated with a particular clock network. The design specifications may also include different buffer types (e.g., buffer sizes as indicated by their input capacitances) that may be included in each clock network associated with a clock domain. Further, the design specifications may include a maximum fanout and a minimum fanout for each clock domain, such that a fanout range for each clock network may be determined. The fanout range may be based on various timing and design constraints of each clock domain associated with each clock network.

At step 204, the meta-synthesis tool may determine a topology of each clock network for each clock domain based on the design specifications received in step 202. As described in further detail with respect to method 400 of FIG. 4, the meta-synthesis tool may determine a series of design parameters based on the topology. The design parameters may be included in a tool specification file that may be used by the synthesis tool such that the synthesis tool synthesizes the clock network according to the determined topology.

For example, the topology may be determined such that the fanout at each stage (e.g., driving buffer) of all levels is within the fanout range and such that the fanout for each buffer within a particular level may be the same. Additionally, the topology may be determined such that the path from the clock source to every endpoint may be the same in terms of passing through the same number of stages or levels. Additionally, the determined topology may be such that the clock signal may pass through the same types of buffers (e.g., buffers of the same size) as it reaches each endpoint. As noted above, an example of an identical path for each endpoint is illustrated in FIG. 1a and 1b. The specified topology may also include only the buffers within the predefined set of buffers received in step 202.

Figure 3:
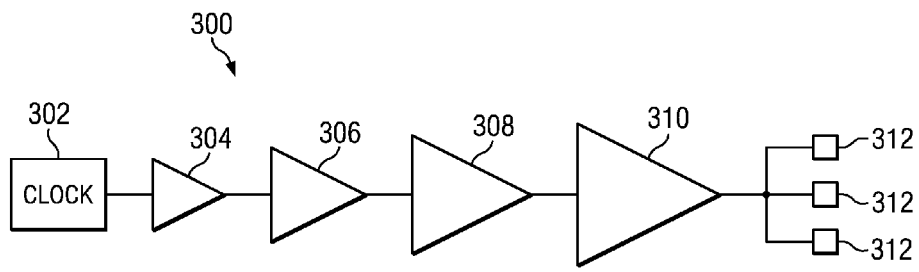
FIG. 3 illustrates an example clock network where the tree is split as far from the clock source as possible.

Further, the topology may be determined such that the tree is split into branches as far from the clock source as possible. FIG. 3 illustrates an example clock network 300 where the tree is split as far from the clock source as possible. Clock network 300 includes buffers 304, 306, 308 and 310 and endpoints 312. In this particular example, the split of the tree of clock network 300 may not occur until buffer 310 drives endpoints 312. In other embodiments of clock networks, the split may occur earlier, such as at buffer 108 in clock network 100 of FIG. 1a.

Returning to FIG. 2, the topology determined during the meta-synthesis of step 204 may also be such that a minimum number of stages between a clock source and an endpoint that comply with the fanout range are obtained. Finally, in instances where a buffer comprises a single inverter, the topology may be determined such that an even number of stages associated with any path from the clock source to an endpoint is obtained. Due to inverters inverting a clock signal, an even number of stages may be desirable when the buffers comprise inverters such that the clock signal received at the endpoints 104 is not inverted as compared to the clock signal generated at the clock source.

At step 205, the meta-synthesis tool may determine design parameters based on the determined topology of a clock network. The design parameters may indicate the number of endpoints included in a clock network. Further, the design parameters may indicate the number of levels for the clock network and the number of stages (e.g., driving buffers) for each level. The design parameters may also indicate the desired fanout for each buffer, and the type of buffer to be used at each level.

Following the meta-synthesis performed at steps 204 and 205, the meta-synthesis tool may generate, at step 206 a tool specification file that includes the design parameters determined at step 205. The tool specification file may be any suitable file that may be read by a clock network synthesis tool as input to synthesize a clock network.

At step 208, a clock synthesis tool of the IHS may synthesize the clock network based on the tool specification file generated in step 206. The clock synthesis tool may comprise any suitable program configured to synthesize a clock network. The design parameters included in the specification file may be used by the synthesis tool to generate a clock network that has the topology determined in step 205 and that accordingly conforms with the designer's vision for the clock network. Following step 208, method 200 may end.

Therefore, method 200 may be used to generate a desired clock network by giving the designer unique control over the clock network synthesis tools. By including the meta-synthesis process, method 200 may separate the clock network synthesis into two phases, with the meta-synthesis phase providing a higher level abstraction of the clock network for the designer (e.g., fanout range, buffer types, number of endpoints etc.) to generate a tool specification file based on the higher level design specifications. The specification file may then be used by the synthesis tool to obtain the low level implementation. Accordingly, this separation allows the designers to focus on the higher level design aspects of the clock network and provides a way to circumvent limitations associated with conventional clock network synthesis tools.

Modifications, additions or omissions may be made to FIG. 2 without departing from the scope of the present disclosure. For example, as described in further detail with respect to FIG. 4, the meta-synthesis of steps 204 and 205 may include a plurality of steps to determine the topology and design parameters of the clock network. Additionally, in some embodiments, one IHS may be configured to perform the meta-synthesis (e.g., determine the topology and generate the tool specification file) while another IHS with the clock synthesis tool stored thereon may receive the tool specification file and synthesize the clock network accordingly.

Figure 4:
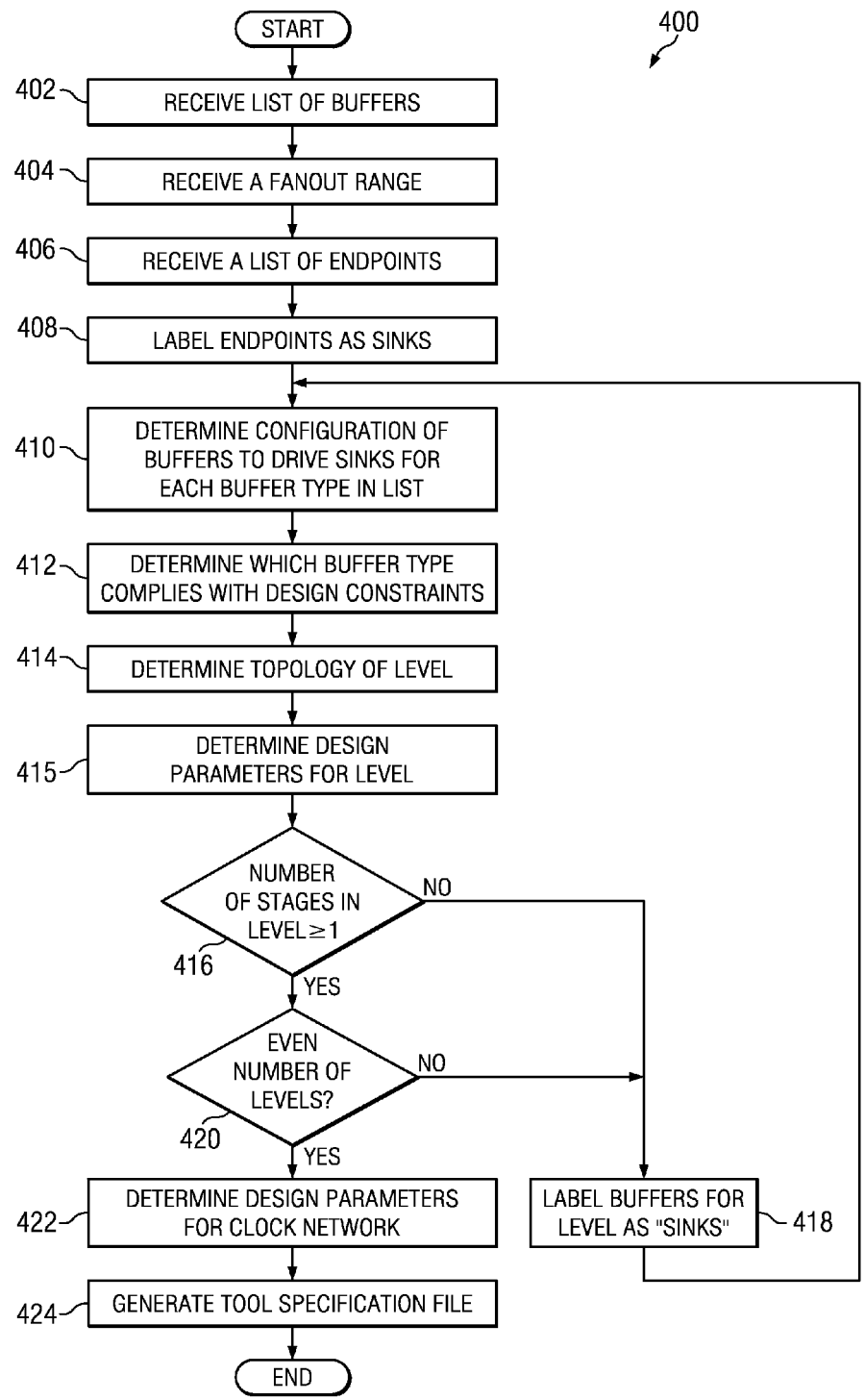
FIG. 4 illustrates an example method for determining a topology of a clock network in accordance with some embodiments of the present disclosure.

FIG. 4 illustrates an example method 400 for determining a topology of a clock network in accordance with some embodiments of the present disclosure.

Method 400 may be performed by a meta-synthesis tool that comprises instructions embedded in memory of an information handling system. The IHS may include a processor configured to execute the meta-synthesis tool instructions embedded in the memory of the information handling system.

Method 400 may begin, and at step 402, a meta-synthesis tool may receive from a clock network designer a list of buffer types (e.g., buffer sizes as indicated by their input capacitances) that may be included in a clock network being designed by the designer. Accordingly, the buffers of the clock network may be limited to the predefined set received from the designer at step 402. At step 404, the meta-synthesis tool may receive a fanout range for the clock network. As mentioned above, the fanout range may include a minimum fanout and a maximum fanout for each stage of the clock network. Additionally, at step 406, the meta-synthesis tool may receive a list of endpoints (e.g., flip-flops) that may be within the clock domain of the clock network and thus driven by a clock distributed by the clock network. Accordingly, at steps 402 through 406, the meta-synthesis tool may receive design specifications for the clock network, similarly to step 202 of method 200 in FIG. 2. Although, disclosed in a particular order, it is understood that steps 402 through 406 may be performed in a different order, at the same time or any combination thereof.

At step 408, the meta-synthesis tool may label the endpoints received at step 406 as sinks that are to be driven by one or more buffers. At step 410, the meta-synthesis tool may determine for a level of buffers driving the sinks, a configuration of buffers that may be needed to drive the sinks for each buffer type included in the list of buffer types received in step 402. The buffer configuration determined for each buffer type may be based on the fanout range received at step 404 and other design specifications (e.g., the number of endpoints 510, the input capacitance of endpoints 510, the capacitance of wires 512, etc.). The buffer configuration may also be based on other desired properties of the clock network. For example, each buffer in the level may need to have the same fanout to ensure the synchronous nature of the clock network.

Therefore, the configuration for each buffer type may be determined such that each buffer has the same fanout that is within the fanout range. The configurations that do not have the same fanout and/or that are not within the fanout range may be discarded and/or disregarded.

FIGS. 5-8 illustrate example buffer configurations that may be generated and/or analyzed by a meta-synthesis tool to determine a configuration of buffers driving a plurality of sinks for each buffer type of a list of buffers. For example, FIG. 5 illustrates an example of the design specifications received at steps 402-406 of method 400 in FIG. 4. FIG. 5 illustrates a buffer set 501 of buffer types that may be included in a list of buffers received by the meta-synthesis tool. In the present example, buffer set 501 may include a buffer 502 that may correspond with a buffer type that has an input capacitance of one, a buffer 504 that may correspond with a buffer type that has an input capacitance of two and a buffer 506 that may correspond with a buffer type that has an input capacitance of three.

FIG. 5 also illustrates an endpoint set 508 of endpoints 510 that may be driven by a clock distributed through the clock network being designed. In the present example, endpoint set 508 may include endpoints 510*a* through 510*h* that may each include an input capacitance of two. Additionally, in the present example, each endpoint 510 may be coupled to an associated wire 512 that may couple the endpoint 510 to a buffer. In the current example, each wire 512 may have a capacitance of one. Therefore, in this example, the load capacitance each endpoint 510 and wire 512 may induce on a buffer driving an endpoint 510 may be four. Additionally, the maximum ("max") fanout for the clock network (e.g., as indicated by the clock network designer in step 404 of method 400 in FIG. 4) may be five and the minimum ("min") fanout for the clock network may be three, such that the fanout range for the clock network may be between three and five.

As illustrated in further detail with respect to FIGS. 6-8, the meta-synthesis tool may label the endpoints as sinks and may determine a configuration of buffers driving endpoints 510 for each buffer type (e.g., buffer type 502, buffer type 504 and buffer type 506) of buffer set 501 based on the max fanout and the min fanout and other design specifications indicated (e.g., the number of endpoints 510, the input capacitance of endpoints 510, the capacitance of wires 512, etc.). Accordingly, as described further below, the meta-synthesis tool may determine, for each buffer of buffer set 501, a buffer configuration for the level of the clock network that drives endpoints 510.

For example, FIG. 6 illustrates an example buffer configuration 600 of buffers 502 driving endpoints 510 based on the fanout range and other design specifications (e.g., the number of endpoints 510, the input capacitance of endpoints 510, the capacitance of wires 512, etc.). The fanout of a buffer 502 coupled to an endpoint 510 via a wire 512 may be three due to the ratio of the load capacitance (e.g., the capacitance of the endpoint 510 combined with the capacitance of the wire 512) of the buffer 302 over the input capacitance of the buffer 502 being three. Additionally, the fanout of a buffer 502 coupled to two endpoints 510 via two wires 512 may be six. As mentioned above, the allowed fanout range in the present example may be between three and five. Therefore, in the present example, a buffer 502 driving one endpoint 510 may be within the fanout range, but a buffer 502 driving more than one endpoint 510 may produce a fanout that is outside of the fanout range. Consequently, the meta-synthesis tool may determine that buffer configuration 600 where each buffer 502 is driving an individual endpoint is the only configuration of buffers 502 driving endpoints 510 that complies with the fanout range, of the present example. The fanout for each buffer 502 may be the same also, therefore, the meta-synthesis tool may determine that buffer configuration 600 is a configuration that complies with the design specifications and may be considered. The meta-synthesis tool may similarly determine buffer configurations for buffer 504 driving endpoints 510 and buffer 506 driving endpoints 510.

FIGS. 7a and 7b illustrate buffer configurations 700 and 702 respectively of buffers 504 driving endpoints 510. FIG. 7a illustrates buffer configuration 700 where each buffer 504 is driving two endpoints 510 such that the fanout of each buffer 504 is three. As mentioned above, the fanout range in the particular example is three through five, therefore the fanout of each buffer 504 is within the fanout range. Additionally, in buffer configuration 700 each buffer 504 has the same fanout such that the delay of clock signals being distributed to endpoints 510 may be the same. Accordingly, the meta-synthesis tool may determine that buffer configuration 700 for buffers 504 is a configuration that complies with the design specifications and may be considered.

FIG. 7b illustrates a buffer configuration 702 where buffers 504a and 504b are each driving three endpoints 510 (e.g., endpoints 510a - 510c for buffer 504a and endpoints 510d-510 for buffer 504b) and have a fanout of 4.5 each that is within the indicated fanout range. Additionally, buffer configuration 702 may include buffer 504c coupled to endpoints 510g and 510h, with a fanout of three that is also within the indicated fanout range. However, although the fanout of each buffer 504 in buffer configuration 702 is within the fanout range, the meta-synthesis tool may discard or disregard buffer configuration 702 because the fanout of buffers 504a and 504b may not be the same as the fanout of buffer 504c.

FIGS. 8a, 8b and 8c illustrate buffer configurations 800, 802 and 804 respectively of buffers 506 driving endpoints 510. FIG. 8a illustrates buffer configuration 800 where buffers 506a and 506b are driving endpoints 510a through 510c and endpoints 510d through 510f respectively. Additionally, buffer 506c of buffer configuration 800 may drive remaining endpoints 510g and 510h. The fanout of buffers 506a and 506b in buffer configuration 800 may be three and may accordingly be within the fanout range of three through five of the present example. However, the fanout of buffer 506c may be two which may be outside of the fanout range of three through five of the present example. Additionally, the fanout of each buffer 506 may not be the same. Therefore, the meta-synthesis tool may disregard and/or discard buffer configuration 800.

FIG. 8b illustrates a buffer configuration 802 that includes buffer 506a driving endpoints 510a through 510d and buffer 506b driving endpoints 510e through 510h. The fanout of each of buffers 506a and 506b may be four, which is within the fanout range of three through five for the present example. Due to the fanout being within the fanout range and being the same for both buffers 306a and 306b of buffer configuration 802, buffer configuration 802 may satisfy the design constraints of the clock network and may be considered by the meta-synthesis tool a buffer configuration of buffers 506 that complies with the design specifications.

FIG. 8c illustrates a buffer configuration 804 that includes a buffer 506a driving endpoints 510a through 510e and a buffer 506b driving endpoints 510f through 510h. In buffer configuration 804, the fanout of buffer 506a may be five, which may be within the fanout range of the particular example, and the fanout of buffer 506b may be three, which also may be within the fanout range of this particular example. However, due to the fanout not being the same for buffer configuration 804, the meta-synthesis tool may disregard and/or discard buffer configuration 804.

Therefore, as illustrated in FIGS. 5-8, a meta-synthesis tool may determine, for each buffer type, a buffer configuration driving endpoints that complies with the design specifications (e.g., buffer configuration 600 for buffer 502, buffer configuration 700 for buffer 504 and buffer configuration 802 for buffer 506).

Modifications, additions or omissions may be made to FIGS. 5-8 without departing from the scope of the present disclosure. The specific number and type of buffers and endpoints, the specific fanout range etc. are merely used as examples to illustrate how a meta-synthesis tool may determine buffer configurations that comply with design considerations. It is understood that many variations within the scope of the present disclosure may occur based on the particular design of a clock network.

Returning to FIG. 4, following step 412 where the meta-synthesis tool may determine a buffer configuration for each buffer type indicated in the list of buffers, at step 414, the meta-synthesis tool may select a buffer configuration for the level currently being analyzed based on the buffer configurations determined in step 412. In some embodiments, the meta-synthesis tool may select the buffer configuration that has the smallest number of stages (e.g., driving buffers). By selecting the configuration that has the smallest number of stages, the meta-synthesis tool may reduce the number of levels and/or stages of the clock network such that it is at a minimum according to the design constraints (e.g., at a minimum for the buffer types and fanout as indicated by the designer). Further, as described above, each configuration may include the same buffer type, therefore by selecting a configuration for the level of the clock network the meta-synthesis tool may ensure that the buffer type for the level is the same. Additionally, as explained above, the fanout of each buffer may also be the same.

For example, returning to FIGS. 5-8, the meta-synthesis tool may determine which of buffer configurations 600, 700 and 802 of FIGS. 6, 7a and 8b respectively may be used as the level that drives endpoints 510. In the present example, the meta-synthesis tool may select the buffer configuration that has the fewest number of stages. As illustrated in FIGS. 6, 7a and 8b respectively, buffer configuration 600 may include eight stages, buffer configuration 700 may include four stages and buffer configuration 802 may include two stages. The meta-synthesis tool may accordingly select buffer configuration 802 for the level that drives endpoints 510. Therefore, the meta-synthesis tool may determine a topology (e.g., buffer configuration 802) for the level of the clock network associated with the buffers that drive endpoints 510.

Following step 414, method 400 may proceed to step 415. At step 415, the meta-synthesis tool may determine design parameters for the current level of the clock network being analyzed based on the topology (e.g., buffer configuration) selected at step 414. For example, with respect to buffer configuration 802 selected in the example above, the meta-synthesis tool may determine design parameters for the particular level that indicate that the clock network includes eight endpoints 510 with a capacitance of two each. The design parameters may also indicate that the endpoints 510 may be driven by two buffers 506 with an input capacitance of three and that the two buffers 506 are to have a fanout of four.

Following step 415, the meta-synthesis tool may determine whether the number of stages in the level currently being analyzed is equal to one. If the number of stages is greater than one, method 400 may proceed to step 418 where the meta-synthesis tool may label the buffers of the stage just analyzed as sinks Following step 418, method 400 may return to steps 410-416 where a buffer configuration may be selected to drive the buffers now labeled as sinks By first generating buffer configurations based on the endpoints and moving backwards to determine a buffer configuration to drive the buffers driving the endpoints and so forth until reaching the clock generator, and by using the minimum number of buffers for a particular level, method 400 may ensure that the clock network is split as far from the clock generator of the clock network as possible.

For example, in the example in FIGS. 5-8, buffer configuration 802 may be selected as the desired topology for the level driving endpoints 510. The number of stages (e.g., buffers 506) in buffer configuration 802 may be two and is consequently greater than one. Accordingly, the meta-synthesis tool may label buffers 506 as sinks and then may determine a buffer configuration that may drive buffers 506 in a similar manner as that described above in FIGS. 5-8 for determining and selecting buffer configuration 802.

As mentioned above, if the number of stages in the level is equal to one in step 416, method 400 may proceed to step 420. In the present example, at step 420, the meta-synthesis tool may determine whether there is an even number of levels in the clock network. If there is an even number of levels, method 400 may proceed to step 422, otherwise method 400 may return to steps 418 and 410 through 416 such that another level is added. In embodiments where the buffers comprise a single inverter, step 420 may be used to ensure that the clock signal being received by the endpoints is not inverted because an odd number of inverters will create an inverted signal, whereas an even number of inverters will not have an inverted signal. In embodiments where the buffers comprise a series of two inverters, step 420 may be unnecessary because the inversion of the clock signal may not occur.

If the number of levels in the clock network is even, method 400 may proceed to step 422 where the meta-synthesis tool may determine the design parameters for the clock network based on the topology and design parameters of the levels determined above. For example, the meta-synthesis tool may analyze the buffer configurations determined for each level to determine design parameters that include a number of levels of the clock network, the number of stages for each level, the buffers used for each level and stage, the fanout of each buffer, etc.

At step 424, the meta-synthesis tool may generate a specification file for a synthesis tool that includes the design parameters described above with respect to step 422. The specification file may include the design parameters such that the synthesis tool synthesizes the clock network according to the determined topology. Additionally, as mentioned above, the topology may be determined and based on specific design parameters received from the clock network designer. Accordingly, the meta-synthesis tool may facilitate a designer's control over the design and/or construction of a clock network by generating a tool specification file that produces a clock network that is envisioned by the designer.

Modifications, additions or omissions may be made to method 400 without departing from the scope of the present disclosure. The order of the steps may be different than that described, steps may be performed at the same time, steps may be added and/or steps may be removed. For example, in some embodiments, step 415 where the design parameters for an individual level are determined may be performed in conjunction with step 422 where the design parameters for the entire clock network may be determined.

Although the present disclosure has been described with several embodiments, a myriad of changes, variations, alterations, transformations, and modifications may be suggested to one skilled in the art, and it is intended that the present disclosure encompass such changes, variations, alterations, transformations, and modifications as fall within the scope of the appended claims.

What is claimed is:

1. A two-phase method of constructing a clock network comprising:
   receiving design specifications for a clock network at a meta-synthesis tool in a metasynthesis phase of the two-phase method, the meta-synthesis phase providing an abstraction of the clock network, wherein the meta-synthesis tool is configured to:
   determine a topology of the clock network based on the design specifications, the topology indicating at least one of a plurality of levels of the clock network, a buffer type for each level and a buffer fanout for each level;
   determine design parameters for the clock network based on the determined topology;
   generate a clock network synthesis tool specification file that includes the design parameters, the clock network synthesis tool specification file generated as input to a clock network synthesis tool; and
   synthesizing, by the clock network synthesis tool in a synthesis phase of the two-phase method, the clock network according to the clock network synthesis tool specification file such that the clock network includes the determined topology and such that the clock network synchronously distributes a clock signal from a clock generator to endpoints of the clock network, the synthesis phase providing an implementation of the clock network.

2. The method of claim 1, wherein the design specifications comprise at least one of a fanout range of the clock network, a set of buffer types for the clock network and a set of endpoints for the clock network.

3. The method of claim 1, wherein the determined topology further indicates that the buffer type of a first buffer included in a particular level is the same as the buffer type of a second buffer included in the particular level.

4. The method of claim 1, wherein the determined topology further indicates that the buffer fanout of a first buffer included in a particular level is the same as the buffer fanout of a second buffer included in the particular level.

5. The method of claim 1, wherein the determined topology further indicates paths from the clock generator to each endpoint of the clock network, wherein the paths are replicas of each other.

6. The method of claim 1, wherein the determined topology further indicates an even number of levels of the clock network.

7. The method of claim 1, wherein the buffer type IS restricted to a predefined set of buffer types as indicated in the design specifications.

8. The method of claim 1, wherein determining the topology further comprises determining a configuration of buffers for each level of the clock network based on the design specifications.

9. The method of claim 1, wherein the determined design parameters include at least one of the plurality of levels of the clock network, the buffer type for each level and the buffer fanout for buffers included in each level as indicated by the topology.

10. The method of claim 1, wherein the determined topology comprises a clock tree split as far from the clock signal as allowed by the design specifications.

11. An article of manufacture for constructing a clock network, comprising:
    a computer readable medium; and first computer-executable instructions carried on the computer readable medium, the instructions readable by a processor, the instructions, when read and executed, causing the processor to implement a meta-synthesis tool, the meta-synthesis tool providing an abstraction of the clock network and configured to:

receive design specifications for a clock network;

determine a topology of the clock network based on the design specifications, the topology indicating at least one of a plurality of levels of the clock network, a buffer type for each level and a buffer fanout for each level;

determine design parameters for the clock network based on the determined topology; and generate a clock network synthesis tool specification file that includes the design parameters, the clock network synthesis tool specification file usable as input to a clock network synthesis tool;

second computer-executable instructions carried on the computer readable medium, the instructions readable by a processor, the instructions, when read and executed, causing the processor to implement a clock network synthesis tool, the clock network synthesis tool providing an implementation of the clock network and configured to:

synthesize, according to the clock network synthesis tool specification file, the clock network to include the determined topology and such that the clock network synchronously distributes a clock signal from a clock generator to endpoints of the clock network.

12. The article of manufacture of claim 11, wherein the design specifications comprise at least one of a fanout range of the clock network, a set of buffer types for the clock network and a set of endpoints for the clock network.

13. The article of manufacture of claim 11, wherein the determined topology further indicates that the buffer type of a first buffer included in a particular level is the same as the buffer type of a second buffer included in the particular level.

14. The article of manufacture of claim 11, wherein the determined topology further indicates that the buffer fanout of a first buffer included in a particular level is the same as the buffer fanout of a second buffer included in the particular level.

15. The article of manufacture of claim 11, wherein the determined topology further indicates paths from the clock generator to each endpoint of the clock network, wherein the paths are replicas of each other.

16. The article of manufacture of claim 11, wherein the determined topology further indicates an even number of levels of the clock network.

17. The article of manufacture of claim 11, wherein the buffer type is restricted to a predefined set of buffer types as indicated in the design specifications.

18. The article of manufacture of claim 11, wherein the processor is further caused to determine the topology by determining a configuration of buffers for each level of the clock network based on the design specifications.

19. The article of manufacture of claim 11, wherein the determined design parameters include at least one of the plurality of levels of the clock network, the buffer type for each level and the fanout for buffers included in each level as indicated by the topology.

20. The article of manufacture of claim 11, wherein the determined topology comprises a clock tree split as far from the clock signal as allowed by the design specifications.

* * * * *